United States Patent
Lee et al.

(10) Patent No.: US 9,143,710 B2
(45) Date of Patent: Sep. 22, 2015

(54) SENSOR-INTEGRATED CHIP FOR CCD CAMERA

(75) Inventors: Jung Won Lee, Seoul (KR); Seok Yong Hong, Jeon-ju (KR); Jeong Ho Lim, Gunpo (KR)

(73) Assignee: SEMISOLUTION CO., LTD. (KR)

(*) Notice: Subject to any disclaimer, the term of this patent is extended or adjusted under 35 U.S.C. 154(b) by 0 days.

(21) Appl. No.: 14/113,032

(22) PCT Filed: Apr. 21, 2012

(86) PCT No.: PCT/KR2012/003100
§ 371 (c)(1),
(2), (4) Date: Oct. 21, 2013

(87) PCT Pub. No.: WO2012/144869
PCT Pub. Date: Oct. 26, 2012

(65) Prior Publication Data
US 2014/0043513 A1    Feb. 13, 2014

(30) Foreign Application Priority Data
Apr. 22, 2011  (KR) .................. 10-2011-0037931

(51) Int. Cl.
| H04N 5/335 | (2011.01) |
| H04N 5/225 | (2006.01) |
| H04N 5/372 | (2011.01) |
| H01L 27/146 | (2006.01) |

(52) U.S. Cl.
CPC .......... *H04N 5/372* (2013.01); *H01L 27/14618* (2013.01)

(58) Field of Classification Search
CPC ................... H04N 5/372; H01L 27/14618
USPC ............... 257/668, 693, 701, 706, 712, 713; 438/125; 348/311, 294, 302, 373
See application file for complete search history.

(56) References Cited

U.S. PATENT DOCUMENTS

| 5,745,322 | A  | * | 4/1998 | Duffy et al. ............... 361/45 |
| 6,933,976 | B1 | * | 8/2005 | Suzuki .................... 348/315 |
| 2002/0039144 | A1 | * | 4/2002 | Yamada .................. 348/311 |
| 2003/0223008 | A1 |  | 12/2003 | Kim et al. |
| 2003/0234886 | A1 | * | 12/2003 | Cho et al. ................ 348/340 |
| 2005/0104205 | A1 | * | 5/2005 | Wang ..................... 257/730 |
| 2006/0051890 | A1 | * | 3/2006 | Bolken et al. ............ 438/106 |
| 2007/0009249 | A1 |  | 1/2007 | Kim |
| 2007/0126899 | A1 |  | 6/2007 | Kim |
| 2009/0166774 | A1 | * | 7/2009 | Takahira ................. 257/431 |

FOREIGN PATENT DOCUMENTS

KR    20030091549    12/2003

OTHER PUBLICATIONS

Intrnational Search Report—PCT/KR2012/003100 dated Nov. 29, 2012.

* cited by examiner

*Primary Examiner* — Sinh Tran
*Assistant Examiner* — Mark Monk
(74) *Attorney, Agent, or Firm* — Cantor Colburn LLP

(57) ABSTRACT

The present invention relates to a sensor-integrated chip for a CCD camera in which a CCD sensor, an H/V driver for driving the CCD sensor, and an ISP (Image Signal Process) chip, which inputs a control signal for driving the CCD sensor to the H/V driver and allows a video to be displayed on a monitor (not shown) in response to an output signal from the CCD sensor, are stacked and connected with each other by inter-pad wire bonding into one IC package to be one chip, by an SIP (system In Package) method.

6 Claims, 2 Drawing Sheets

SENSOR-INTEGRATED CHIP FOR CCD CAMERA

TECHNICAL FIELD

The present invention relates to a semiconductor device, particularly a sensor-integrated chip for a CCD (Charged Coupled Device) camera including a CCD sensor and relevant driving circuits.

BACKGROUND ART

Image sensors are electronic devices that respond to light and are also an assembly of light sensors composed of a large number of pixels, and function as the eyes of a human.

Image sensors are largely classified into a CCD (Charged Coupled Device) type and a CMOS (Complementary Metal Oxide Semiconductor) type.

The CMOS type can be achieved by a common process of manufacturing a semiconductor, such that manufacturing cost is low. Further, the CMOS type is suitable for long time use because the amounts of generated heat and consumed power are small, such that it is used for a video device of which the image quality is not so important, such as a CCTV.

In addition, the CCD type is advantageous in an environment with insufficient light, because it has a good color tone and a high sensitivity. Further, the CCD type currently has competitiveness in price, such that it has been used for small-sized digital cameras.

Further, image sensors with the CMOS type can be manufactured by stacking an image sensor and a driving circuit on one chip, using a common method of manufacturing a semiconductor.

DISCLOSURE OF INVENTION

Technical Problem

However, image sensors with the CCD type consist of an image sensor and a driving circuit manufactured in different chips, respectively, because being manufactured by a method different from a common method of manufacturing a semiconductor.

Therefore, the image sensors with the CCD type has a large number of components than the image sensors with the CMOS type and the spaces for the components increase, such that it is difficult to efficiently mount the components, and thus, it is difficult to reduce the size of the CCD type of image sensors.

Solution to Problem

In order to solve the problem, it is an object of the present invention to provide a sensor-integrated chip for a CCD camera which is formed by manufacturing a CCD image sensor and peripheral circuits with individual dies and then stacking the sensor and the circuits in a SIP (System In Package) method to minimize the size in one IC package.

That is, it is an object of the present invention to provide a technology of integrating a CCD sensor with peripheral circuits and a technology of implementing a single package chip including the CCD sensor.

In order to achieve the object of the present invention, a sensor-integrated chip for a CCD camera includes: a CCD sensor chip sensing incident light; a signal driving chip that drives the sensor chip; and an ISP chip integrated with peripheral circuits for image processing, in which the chips are stacked and connected by inter-pad wire bonding into one package to be one chip by an SIP (System In Package) method.

In this configuration, it is preferable that a protective layer for reducing noise due to signal interference between the chips and blocking heat generated by a high-voltage circuit is formed under each of the chips.

In this configuration, it is preferable that a color filter array and a microlens are disposed at the upper portion of the front of the CCD sensor chip.

In this configuration, it is preferable that a board is disposed under the ISP chip.

It is preferable that the inter-pad wire bonding is used for the connection between the CCD sensor chip and the signal driving chip, and the connection between the signal driving chip and the ISP chip.

The ISP chip and the board are connected by wire bonding for a package.

In this configuration, the CCD sensor chip, the signal driving chip, and the ISP chip are supported by a frame (housing).

A heat-dissipating chip with the center bored is further disposed in order not to block the upper portion of the front of the CCD sensor chip and wires for transferring heat from the signal driving chip and the ISP chip are connected to the heat-dissipating pad.

The signal driving chip is an H/V (Horizontal/Vertical) driver, an H-driver, or a V-driver that drives the CCD sensor.

The ISP chip includes an AFE (Analog Front End) that converts an analog signal from a CCD sensor into a digital signal, an ISP (Image Signal Processing) that processes the digitalized video, a TG (Timing Generator) that generates a signal for driving the CCD sensor in response to control of the ISP, and a power management that supplies a driving voltage and blocks overvoltage/overcurrent.

Advantageous Effects of Invention

According to the present invention, as the CCD sensor, the HV driver, and the ISP chip are separately manufactured by dies and then stacked, such that it is possible to reduce the size by integrating the components in one IC package and reduce the volume and area for mounting and the power consumption. Further, according to the present invention, since a sensor-integrated chip for a CCD camera is integrated in one package, it is possible to improve the performance, reliability, and convenience of the product and to reduce the cost by reducing the number of components, such that it is possible to improve competitiveness in price in comparison to the existing products.

MODE FOR THE INVENTION

The present invention is described hereafter in detail with reference to the drawings.

The description of technologies known to those skilled in the art is not provided in order to make the spirit and basic features of the present invention clear in the following description of embodiments of the present invention.

Figure 1:
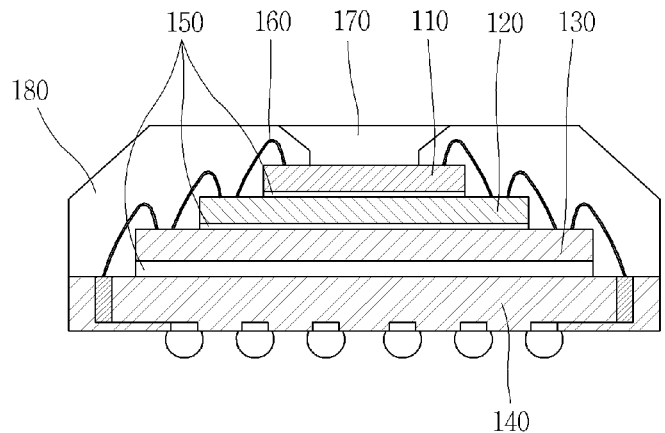
FIG. 1 is a cross-sectional view showing a sensor-integrated chip for a CCD camera manufactured by an SIP method in accordance with an embodiment of the present invention.

FIG. 1 is a cross-sectional view showing a sensor-integrated chip for a CCD camera manufactured by an SIP method in accordance with an embodiment of the present invention, and as shown in the figure, a CCD sensor 110, an H/V driver 120 for driving the CCD sensor 110, and an SIP (Image Signal Process) chip 130 which inputs a control signal for driving the CCD sensor 110 to the H/V driver 120 and allows a video to be displayed on a monitor (not shown) in response to an output signal from the CCD sensor 110, are stacked and connected with each other by inter-pad wire bonding. That is, the sensor-integrated chip for a CCD camera shown in FIG. 1 is implemented by an SIP (System in Package) method.

The CCD sensor 110, H/V driver 120, and ISP chip 130 are manufactured by one die (semiconductor wafer integrated with a circuit), respectively. That is, the CCD sensor 110, H/V driver 120, and ISP chip 130 are manufactured by one die, respectively, through specific processes, stacked on a board 140, and then connected with each other by wires. The ISP chip 130 is manufactured by a CMOS process, and the CCD sensor 110 and the H/V driver 120 are separately manufactured by specific processes.

A color filter array and a microlens 170 are mounted at the upper portion of the front of the CCD sensor 110, the board 140 is disposed under the ISP chip 130, and a housing 180 is disposed to surround the CCD sensor 110, H/V driver 120, and ISP chip 130 and support the sides of the lens 170.

A protective layer 150 is formed between the CCD sensor 110 and H/V driver 120, the H/V driver 120 and ISP chip 130, and the ISP chip 130 and board 140.

The protective layer 150 reduces noise due to signal interference between the chips and blocks heat generated by a high-voltage circuit, such that reliability in driving the ISP chip increases.

The board 140 is a PCB (Printed Circuit Board) and manufactured by a BGA (Ball Grid Array).

The CCD sensor 110 and the H/V driver 120, the H/V driver 120 and the ISP chip 130, and the ISP chip 130 and the board 140 are connected respectively by wires 160.

That is, the embodiment of the present invention shown in FIG. 1 shows that, by integrating the CCD sensor 110, and the H/V driver 120 and the ISP chip 130 which are peripheral circuits into one chip, the function of driving the CCD sensor 110 and a function of performing digital video processing after converting an analog video signal inputted from the CCD sensor 110 into a digital signal and then outputting the processed video signal have been integrated.

Therefore, according to the sensor-integrated chip for a CCD camera shown in FIG. 1, the volume, area, and power consumption are reduced by integrating three dies in one chip and the economical efficiency is increased by simplifying the peripheral circuits.

According to the present invention having the configuration described above, the CCD sensor 110, and the H/V driver 120 and the ISP chip 130 which are signal driving chips (the sensor and the chips are individually manufactured by dies), may be stacked to be integrated in one chip, and problems related to noise interference and heat generation between the CCD 110, H/V driver 120, and ISP chip 130 may be solved.

However, the H/V driver 120 is a high-voltage circuit and a large amount of heat is generated from the sensor when the H/V driver 120 is used for a long period of time. That is, it is necessary to design a structure for dissipating heat generated from the H/V driver 120 in order to keep the normal operation even if the H/V driver 120 is driven for a long period of time, when implementing a sensor-integrated chip for a CCD camera in one chip, as shown in FIG. 1.

Figure 2:
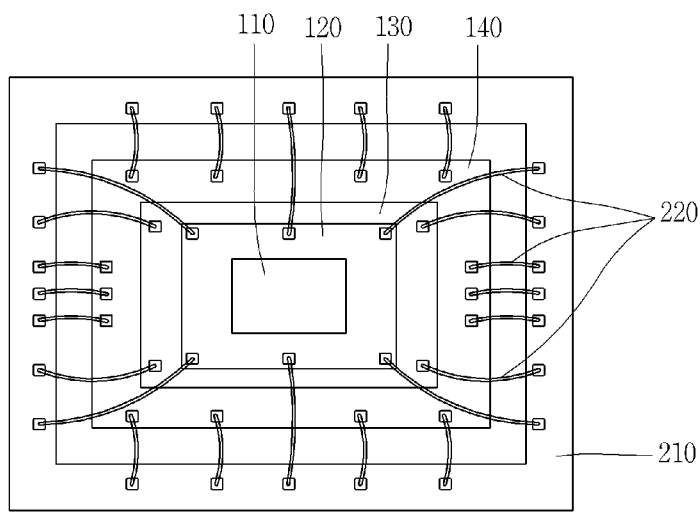
FIG. 2 is a plan view showing a heat-dissipating structure according to an embodiment of the present invention.

FIG. 2 is a plan view showing a heat-dissipating structure of the sensor-integrated chip for a CCD camera shown in FIG. 1, and as shown in the figure, the sensor-integrated chip for a CCD camera shown in FIG. 1 includes a heat-dissipating pad 210 that is disposed at a predetermined distance from the CCD sensor 110, the H/V driver 120, the ISP chip 130, and the board 140, not in contact with them, and connected with the H/V driver 120, the ISP chip 130, and the board 140 by wires 220. That is, the heat-dissipating pad 210 includes a bore formed in the center thereof. The CCD sensor 110, the H/V driver 120, the ISP chip 130, and the board 140 are placed in the bore of the heat-dissipating pad 120 not contacting with the heat-dissipating pad, as shown in FIG. 2. Therefore, heat generated from the H/V driver 120 and the ISP chip 130 can be transferred to the heat-dissipating pad 210 via the wires 220, and dissipated from the heat-dissipating pad 210 to outside.

The heat-dissipating pad 210 is designed such that light traveling into the CCD sensor 110 is not blocked by boring a predetermined region in the pad.

Figure 3:
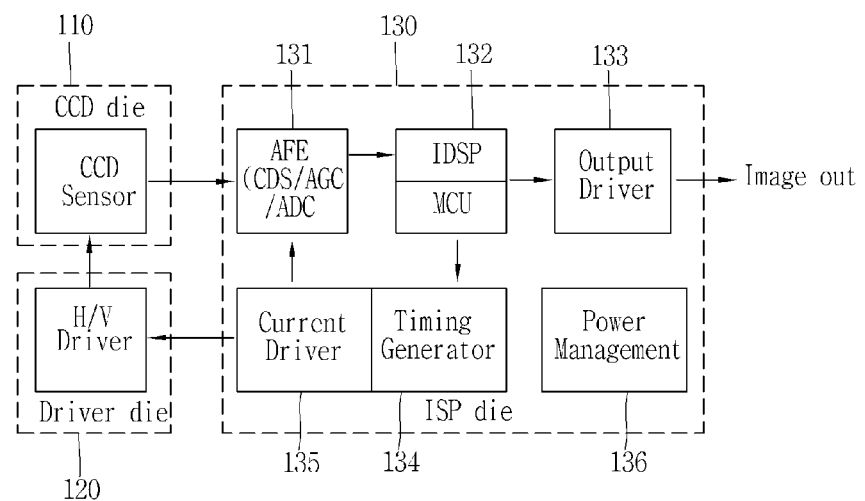
FIGS. 3 and 4 are block diagrams showing the configuration of a sensor-integrated chip for a CCD camera according to an embodiment of the present invention.

A sensor-integrated chip for a CCD camera according to an embodiment of the present invention, as shown in the block diagram of FIG. 3 that shows the configuration, includes the CCD sensor 110, the H/V (Horizontal/Vertical) driver 120, and the ISP chip 130.

The CCD sensor 110 is an HD (High Definition) CCD sensor with 1.3 Mpixel and transmits analog video information generated by incident light to an AFE (Analog Front End) 131 of the ISP chip 130.

The H/V driver 120 supplies a voltage and a current for driving the CCD sensor 110 in response to a control signal outputted from a TG (Timing Generator) 134 of the ISP chip 130.

The ISP chip 130 includes the AFE 131, an ISP (Image Signal Processor) 132, an output driver 133, a TG 134, a current driver 135, and a power management 136.

The AFE 131 is composed of a CDS(Correlated Double Sampler), an AGC (Auto Gain Controller), and an ADC (Analog Digital Converter), and converts an analog signal outputted from the CCD sensor 110 into a digital signal and transmits the digital signal to the ISP 132.

The ISP 132 is composed of an MCU (Micro Control Unit) and an IDSP (Image Digital Signal Process) for video processing. The ISP 132 is provided with video processing algorithms for gamma compensation, improvement of color sensitivity, color compensation, AWB (Auto White Balance), AE (Auto Exposure) and detection of a motion, controls the AFE 131 and the TG 134, and generates a video signal for output on the monitor (not shown) and transmits the video signal to an output driver 133.

The white balance is to set the color temperature to be close to the actual color and the auto white balance is to set the color temperature to automatically find an optimal white balance.

The TG 134 generates a control signal for driving the CCD sensor 110 and transmits the control signal to the AFE 131 and the H/V driver 120 through the current driver 135. That is, the TG 134 generates and controls driving of the CCD sensor 110, an ADC control signal, and timing signals such as V-SYNC and H-SYNC of DSP.

The current driver 135 distributes the control signal from the TG 134 to the AFE 131 and the H/V driver 120.

The power management 136 is a functioning block for managing power for driving the sensor-integrated chip for a CCD camera show in FIG. 1 and allows a normal voltage to be supplied by blocking overvoltage or overcurrent.

The ISP chip 130 having the configuration described above is implemented using a CMOS process with one die.

Meanwhile, in the block diagram shown in FIG. 3, the ISP chip 130 can be provided with integrated various functions, but may be provided with only a basic function.

Figure 4:
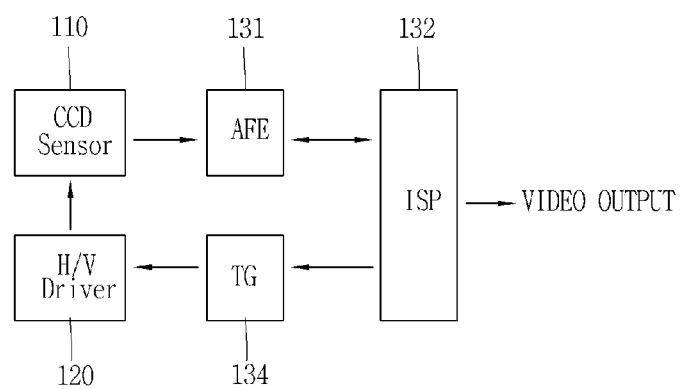

That is, in the embodiment of the present invention, the sensor-integrated chip for a CCD camera, as shown in the block diagram of FIG. 4, may be implemented by mounting only the AFE 131, the ISP 132, and the TG 134 on the ISP chip 130.

The functions of the AFE 131, ISP 132, and TG 134 are the same as those in FIG. 3.

Therefore, CCD image sensor modules are generally expensive because many components are necessarily mounted, but the sensor-integrated chip for a CCD camera having the configuration of FIG. 4 according to the present invention is implemented with a small number of components and the cost is reduced, such that it is possible to provide a video with high image quality in low-priced electronic devices.

That is, since a CCD sensor and components are modularized and mounted when a camera system, including a CCD camera or a CCTV, is manufactured, many chips and passive elements are needed and the space for mounting them correspondingly increases, such that it is difficult to reduce the size of CCD type of cameras in the related art; however, according to the present invention, it is possible to reduce the size of a sensor-integrated chip for a CCD camera and reduce the cost by separately manufacturing the chips with dies and stacking the chips in an SIP method into one IC package to be one chip.

According to the present invention, since the CCD sensor and the peripheral circuits are integrated in one chip, a function of converting an analog video signal inputted from the CCD image sensor into a digital signal and outputting a video after digital video processing and a function of controlling and driving the sensor are integrated.

That is, according to the present invention, as the CCD sensor, the HV driver, and the ISP chip are separately manufactured by dies and then stacked, such that it is possible to reduce the size by integrating the components in one IC package and reduce the volume and area for mounting and the power consumption.

Further, according to the present invention, since the sensor-integrated chip for a CCD camera is implemented by stacking the CCD sensor and the relevant driving circuit in one IC package, it is possible to improve the performance, reliability, and convenience of the product and to reduce the cost by reducing the number of components, such that it is possible to improve competitiveness in price in comparison to the existing products.

In practice, developers using the package proposed in the present invention may develop a product that outputs a digital image, the same as a CIS (CMOS Image Sensor) only with the proposed sensor-integrated chip for a CCD camera.

Although an embodiment of the present invention was described in detail above, it should be understood that the present invention may be implemented in various ways by those skilled in the art without departing from the spirit and basic features of the present invention.

The invention claimed is:

1. A sensor-integrated chip for a CCD camera, comprising:
   a charged coupled device (CCD) sensor chip sensing incident light and including a charged coupled device (CCD) sensor;
   a signal driving chip that drives the CCD sensor chip;
   an image signal processing (ISP) chip integrated with peripheral circuits for image processing, wherein the ISP chip includes at least one or more of an analog front end (AFE) that converts an analog signal from the CCD sensor into a digital signal, an image signal processing that processes a digitalized video, and a timing generator (TG) that generates a signal for driving the CCD sensor in response to control of the image signal processing;
   wherein the ISP chip, the signal driving chip and the CCD sensor chip are stacked in the described order and connected by inter-pad wire bonding into one package to be a single chip,
   a board on which the single chip is disposed, wherein the single chip and the board are connected by wire bonding for a package;
   and a heat-dissipating pad having a bore formed in a center thereof, wherein the single chip and the board is placed in the bore not to contact with the heat-dissipating pad and in order not to block an upper front portion of the CCD sensor chip, and wherein the signal driving chip, the ISP chip, and the board are connected to the heat-dissipating pad through wires for transferring heat generated by the signal driving chip and the ISP chip.

2. The sensor-integrated chip according to claim 1, wherein a protective layer for reducing noise due to signal interference and blocking heat generated by a high-voltage circuit is formed under each of the CCD sensor chip, the signal driving chip and the ISP chip.

3. The sensor-integrated chip according to claim 1, further comprising a housing surrounding and supporting the CCD sensor chip, the signal driving chip, and the ISP chip.

4. The sensor-integrated chip according to claim 1, wherein a color filter array and a microlens are disposed at an upper front portion of the CCD sensor chip.

5. The sensor-integrated chip according to claim 1, wherein the signal driving chip includes an H/V (Horizontal/Vertical) driver, an H-driver, or a V-driver.

6. The sensor-integrated chip according to claim 1, wherein the ISP chip further comprises a power management that supplies a driving voltage and blocks overvoltage/overcurrent.

* * * * *